(12) United States Patent
Nagano

(10) Patent No.: US 6,260,975 B1
(45) Date of Patent: Jul. 17, 2001

(54) POWER CONTROL APPARATUS HAVING A CONTROL VOLTAGE FILTERING MEANS WITH MULTIPLE TIME CONSTANTS

(75) Inventor: Hiroaki Nagano, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/496,464

(22) Filed: Feb. 2, 2000

Related U.S. Application Data

(63) Continuation of application No. PCT/JP98/03040, filed on Jul. 7, 1998.

(51) Int. Cl.$^7$ ...................................................... G05F 1/70
(52) U.S. Cl. ........................... 353/209; 323/205; 323/286
(58) Field of Search .................................... 323/282, 284, 323/288, 205, 209, 286; 333/167, 172; 455/213, 307, 266

(56) References Cited

U.S. PATENT DOCUMENTS 5,408,197 * 4/1995 Miyake ................................. 330/129
5,697,074 * 12/1997 Makikallio et al. .................. 455/126
6,088,573 * 7/2000 Tsuda .................................. 455/13.4

FOREIGN PATENT DOCUMENTS 47-45560   12/1972   (JP) .
4354209    12/1992   (JP) .
53440       1/1993   (JP) .

* cited by examiner

Primary Examiner—Peter S. Wong
Assistant Examiner—Gary L. Laxton
(74) Attorney, Agent, or Firm—Rothwell, Figg, Ernst & Manbeck

(57) ABSTRACT

A power control apparatus is described that includes a power level adjusting circuit (11) for adjusting an input signal to a desired power level in accordance with a control voltage to output a obtained result; a control voltage generating circuit (12 to 18) for comparing a current output power of the power level adjusting circuit (11) with a target power level to generate the control voltage based on a result of comparison; a low-pass filter (19a) operating in accordance with either a first time constant or a second time constant which is smaller than the first time constant, for filtering the control voltage generated by the control voltage generating circuit (12 to 18) to be supplied to the power level adjusting circuit (11); and filter controlling means (19b) for causing the low-pass filter (19a) to operate in accordance with the second time constant at a first transition of the output power of the power level adjusting circuit (11) and for causing the low-pass filter (19a) to operate in accordance with the first time constant after the first transition of the output power of the power level adjusting circuit (11).

15 Claims, 16 Drawing Sheets

POWER CONTROL APPARATUS HAVING A CONTROL VOLTAGE FILTERING MEANS WITH MULTIPLE TIME CONSTANTS

REFERENCE TO RELATED APPLICATION

This Application is a continuation of International application Ser. No.PCT/JP98/03040, whose international filing date is Jul. 7,1998, the disclosure of which Application are incorporated by reference therein. The benefit of filing and priority dates of the International Application is respectfully requested.

BACKGROUND OF THE INVENTION

1. Field of the Invention

The present invention relates to a power control apparatus. More particularly, the present invention relates to an apparatus for automatically adjusting an input signal to a desired power level and outputting the obtained result and to an apparatus suitable for, e.g., a radio transmitter adopting TDMA (Time Division Multiple Access) for carrying out burst transmission.

2. Description of the Background Art

FIG. 19 is a block diagram showing a structure of a conventional power control apparatus, and such an apparatus is disclosed in, for example, Japanese patent laid-open publication No. Hei4-354209. In FIG. 19, the power control apparatus is equipped with: a power amplifier 102; a directional coupler 103; a transmitting antenna 104; a cymoscope 105: direct-current amplifiers 106 and 112; A/D converters 107 and 115; a CPU 108; a PROM 109; a pulse width modulation generator 110; a low-pass filter 111; a temperature detector 113; and a direct-current converter 114.

A modulated high-frequency signal is amplified by the power amplifier 102 and divided into power to be supplied to the transmitting antenna 104 and that to be supplied to the cymoscope 105 by the directional coupler 103. The power supplied to the cymoscope 105 serves as control power for controlling the electric power to be supplied to the transmitting antenna 104, i.e., an output level of a carrier wave.

The control power is detected by the cymoscope 105 and converted into a direct voltage to be amplified by the direct-current amplifier 106. The direct-current voltage amplified by the direct-current amplifier 106 is digital-coded by the A/D converter 107 and fetched in the CPU 108.

Meanwhile, a circuit temperature of the power control apparatus is detected by the temperature detector 113 and supplied to the direct-current converter 114 as a temperature signal. The temperature signal is converted into a direct-current voltage by the direct-current converter 114 and then digitized by the A/D converter 105 to be fetched in the CPU 108.

The CPU 108 generates an appropriate correction instruction signal associated with the circuit temperature based on the above-mentioned two types of digital input data and correction data stored in an PROM 109. The correction instruction signal is fed to the PWM generator 110 in which a pulse-width-modulated control voltage is generated. This control voltage is converted into a direct current voltage by the low-pass filter 111 and amplified by the direct-current amplifier 118. The control voltage amplified.by the direct-current amplifier 118 is supplied to the power amplifier 102 in order to control an output from the power amplifier 102.

In such a conventional power control apparatus, however, a time constant of the low-pass filter 111 for converting the control voltage into the direct-current voltage is a fixed value determined in accordance with characteristics of the lower-pass filter. The control voltage may discretely vary by an amount or period of renewal of the control voltage and, in this case, the low-pass filter having a fixed time constant has such a problem as that the discrete change in the control voltage can not be sufficiently smoothed to stabilize the control loop.

Further, when a low-pass filter having a large time constant is used as the low-pass filter 111 in order to solve the above-described problem, in the high-speed burst transmission of a radio communication apparatus adopting TDMA for example, the rising of the transmitted power slows down to collapse data in the burst leading edge.

Furthermore, if a change in the ambient temperature or a power supply voltage fluctuation of a circuit is observed, the overshoot or undershoot of the transmitted power is generated immediately after start of transmission and immediately after stop of transmission due to the environmental capability, the bias change and the like of the direct-current amplifier, the power amplifier and others.

SUMMARY OF THE INVENTION

In view of the above-described drawbacks, it is an object of the present invention to provide a power control apparatus capable of optimally controlling a first or last transition characteristic of transmitted power by varying a time constant of a low-pass filter at a first or last transition of the transmitted power.

It is another object of the present invention to provide a power control apparatus capable of setting a time constant of a low-pass filter to an optimal value at a first or last transition of transmitted power even if an operational environment is changed due to a fluctuation of a temperature of the apparatus or of an ambient temperature and the like.

To achieve this aim, according to one aspect of the present invention, the invention provides a power control apparatus comprising: a power level adjusting circuit for adjusting an input signal to a desired power level in accordance with a control voltage and outputting the obtained result; a control voltage generating circuit for comparing a current output power of the power level adjusting circuit with a target power level and generating the control voltage based on a result of comparison; a low-pass filter that operates in accordance with either a first time constant or a second time constant smaller than the first time constant and filters the control voltage generated by the control voltage generating circuit to be supplied to the power level adjusting circuit; and filter controlling means for causing the low-pass filter to operate in accordance with the second time constant at a first transition of the output power from the power level adjusting circuit and causing the low-pass filter to operate in accordance with the first time constant after the first transition of the output power from the power level adjusting circuit.

According to another aspect of the present invention, the invention provides a power control apparatus comprising: a power level adjusting circuit for adjusting an input signal to a desired power level in accordance with a control voltage and outputting the obtained result; a control voltage generating circuit for comparing a current output power of the power level adjusting circuit with a target power level and generating the control voltage based on a result of comparison; a low-pass filter that operates in accordance with either a first time constant or a second time constant smaller than the first time constant and filters the control voltage generated by the control voltage generating circuit to be supplied to the power level adjusting circuit; and filter controlling means for causing the low-pass filter to operate in accordance with the first time constant before a last transition of the output power from the power level adjusting circuit and causing the low-pass filter to operate in accordance with the second time constant at the last transition of the output power from the power level adjusting circuit.

According to a further aspect of the present invention, the invention provides a power control apparatus comprising: a power level adjusting circuit for adjusting an input signal to a desired power level in accordance with a control voltage and outputting the obtained result; a control voltage generating circuit for comparing a current output power of the power level adjusting circuit with a target power level and generating the control voltage based on a result of comparison; a low-pass filter that operates in accordance with either a first time constant or a second time constant smaller than the first time constant and filters the control voltage generated by the control voltage generating circuit to be supplied to the power level adjusting circuit; and filter controlling means for causing the low-pass filter to operate in accordance with the second time constant at a first transition of the output power from the power level adjusting circuit, causing the low-pass filter to operate in accordance with the first time constant after the first transition of the output power from the power level adjusting circuit, causing the low-pass filter to operate in accordance with the first time constant before a last transition of the output power from the power level adjusting circuit, and causing the low-pass filter to operate in accordance with the second time constant at the last transition of the output power from the power level adjusting circuit.

The low-pass filter may include: a first resistor; a capacitor cooperating with the first resistor to form a first low-pass filter that operates in accordance with the first time constant; and a second resistor which is connected in parallel to the first resistor and cooperates with the first resistor and the capacitor to form a second low-pass filter that operates in accordance with the second time constant, and the filter controlling means may have a diode connected in series to the second resistor.

Here, the low-pass filter may include: a first resistor; a capacitor cooperating with the first resistor to form a first low-pass filter that operates in accordance with the first time constant; and a second resistor which is connected in parallel to the first resistor and cooperates with the first resistor and the capacitor to form a second low-pass filter that operates in accordance with the second time constant, and the filter controlling means may have a plurality of diodes connected in series to the second resistor and a switch circuit for switching the state of connection between these diodes and the second resistor.

Additionally, the low-pass filter may include: a first resistor; a capacitor cooperating with the first resistor to form a first low-pass filter that operates in accordance with the first time constant; and a plurality of second resistors which are respectively connected in parallel to the first resistor and cooperate with the first resistor and the capacitor to form a second low-pass filter that operates in accordance with the second time constant, and the filter controlling means may have a diode which is in series to each of the multiple second resistors and a switch circuit for selectively connecting the multiple second resistors to the diode.

Moreover, the filter controlling means may have a temperature sensor for detecting a temperature of the power control apparatus or an ambient temperature so that the first and second time constants can be switched in accordance with a temperature detected by the temperature sensor.

In addition, the low-pass filter may include: a first resistor; a capacitor; an active device for cooperating with the first resistor and the capacitor to form the low-pass filter having the first time constant; and a second resistor which is connected to the first resistor in parallel and cooperates with the first resistor, the capacitor and the active device to form a second lowpass filter that operates in accordance with the second time constant, and the filter controlling means may have a diode connected to the second resistor in series.

Further, the second resistor of the low-pass filter may be constituted by a thermistor.

DESCRIPTION OF THE PREFERRED EMBODIMENTS

The present invention will now be described in detail with reference to the accompanying drawings.

Embodiment 1

Description will be given as to an embodiment 1 of a power control apparatus according to the present invention in connection with FIGS. 1 to 5.

Figure 1:
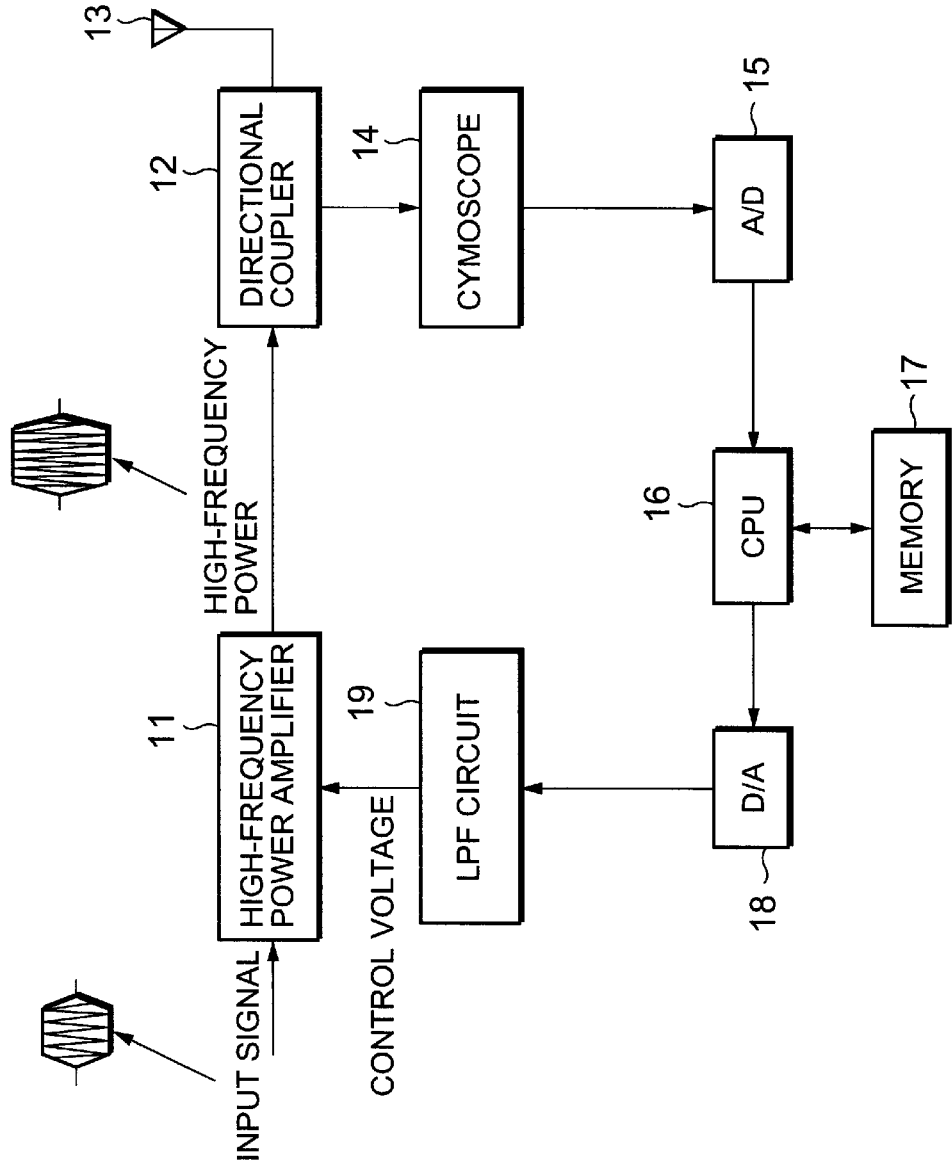
FIG. 1 is a block diagram showing the structure of a power control apparatus according to an embodiment 1 of the present invention.

As shown in FIG. 1, a power control apparatus comprises: a high-frequency power amplifier 11; a directional coupler 12; a transmitting antenna 13; a cymoscope 14; an A/D converter 15; a CPU 16; a memory 17; a D/A converter 18; and an LPF circuit 19.

The high-frequency power amplifier 11 includes a variable gain amplifier (amplifier for automatic gain control (AGC)), a variable attenuator and others and adjusts an input signal to a desired power level to be outputted in accordance with a control voltage. In this example, the high-frequency power amplifier 11 amplifies the input signal to a predetermined power level in accordance with the control voltage and outputs the obtained result as a high-frequency power. This high-frequency power outputted from the high-frequency power amplifier will be referred to as transmitted power hereinbelow. The high-frequency power control amplifier 11 having the above arrangement constitutes a power level adjusting circuit according to the present invention which adjusts the input signal to a desired power level to be outputted in accordance with the control voltage.

The directional coupler 12 divides the high-frequency power from the high-frequency power amplifier 11 into power to be supplied to the transmitting antenna 104 and power to be fed to the cymoscope 14. The transmitting antenna 104 discharges the transmitted power from the directional coupler 12 in the air as electric waves. The cymoscope 14 detects the transmitted power from the directional coupler to be converted into a direct-current voltage. The A/D converter 15 digital-codes the direct-current voltage from the cymoscope 14 to be outputted to the CPU 16, thereby informing the CPU 16 of a current output power level of the high-frequency power amplifier 11.

The CPU 16 operates as described below by executing a predetermined program. That is, the CPU 16 samples the digital code from the A/D converter 15 at predetermined time intervals. The A/D converter 15 then compares the sampled digital code with a reference code previously stored in the memory 17 to obtain a difference value between the both codes. Further, the CPU 16 calculates a setting code for the control voltage based on the difference value and outputs the result to the D/A converter 8. The D/A converter 8 generates the control voltage in accordance with the setting code to be sent to the low-pass filter circuit 19.

The above-described directional coupler 12, the cymoscope 14, the A/D converter 15, the CPU 16, the memory 17 and the D/A converter 18 constitute the control voltage generating circuit according to the present invention which compares the current output power of the power level adjusting circuit with a target power level and generates the control voltage based on a result of comparison.

Figure 2:
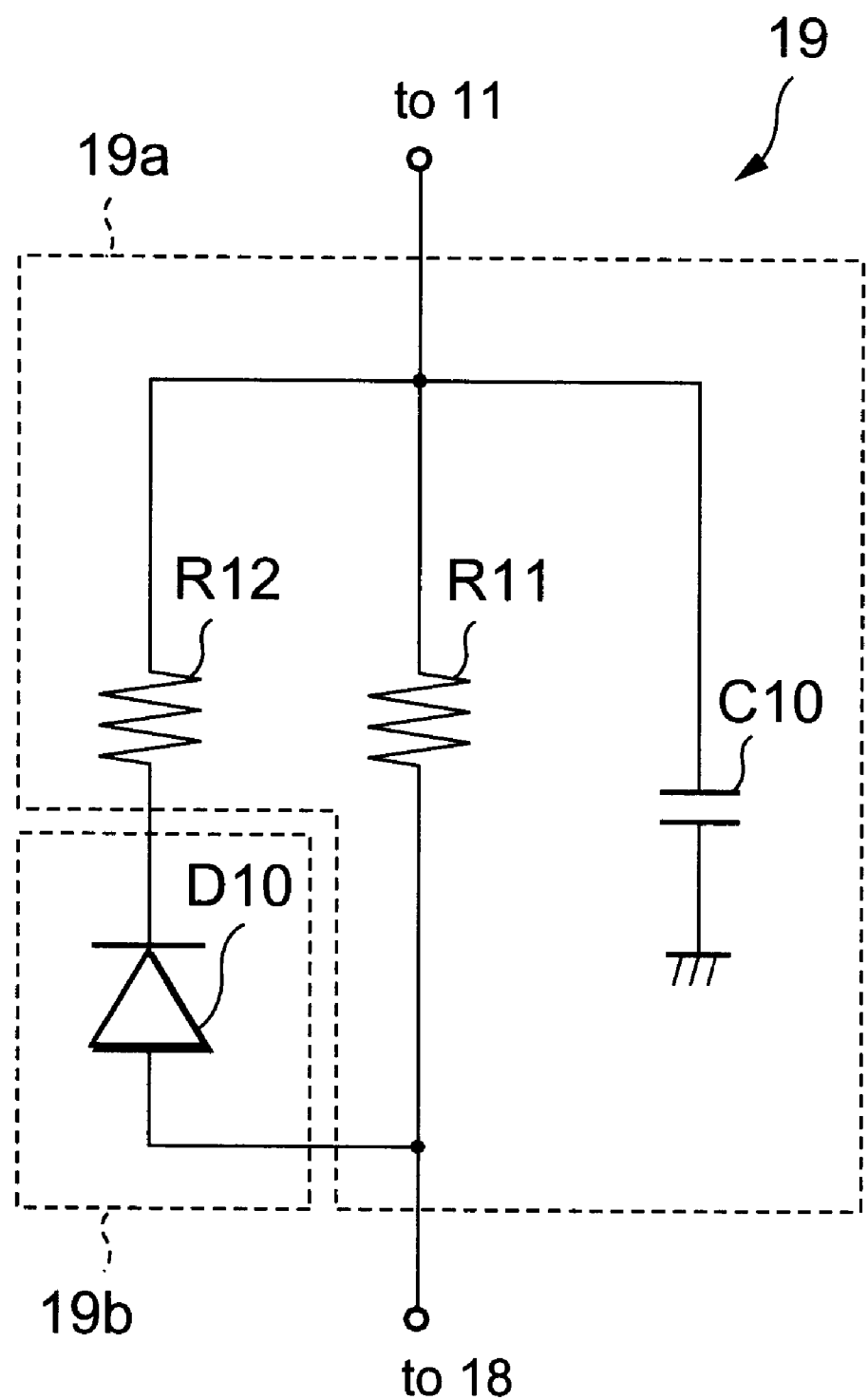
FIG. 2 is a circuit diagram of a low-pass filter circuit included in the power control apparatus according to the embodiment 1 of the present invention.

As shown in FIG. 2, the low-pass filter circuit 19 has a low-pass filter 19a and a filter control circuit 19b. The low-pass filter 19a operates in accordance with either a first time constant or a second time constant smaller than the first time constant and filters the control voltage generated by the D/A converter 18 to be supplied to the high-frequency power amplifier 11. On the other hand, the filter control circuit 19b causes the low-pass filter 19a to operate in accordance with the second time constant at a first transition of the transmitted power and causes the same to operate in accordance with the first time constant after the first transition of the transmitted power, and this circuit constitutes the filter controlling means according to the present invention.

More particularly, the low-pass filter 19a is composed of: a first resistor R11, a capacitor C10 which cooperates with the first resistor to form a first low-pass filter that operates in accordance with the first time constant; and a second resistor R12 which is connected to the first resistor R11 in parallel and cooperates with the first resistor R11 and the capacitor C10 to form a second low-pass filter that operates in accordance with the second time constant. A filter control circuit 29b is constituted by a diode D10 which is connected to the second resistor R12 of the low-pass filter 19a in series.

When the diode D10 is in the OFF state, the second resistor R12 does not function, and hence the low-pass filter 19a can be regarded as the first low-pass filter which is constituted by the first resistor R11 and the capacitor C10 and operates in accordance with the first time constant. On the other hand, when the diode D10 is in the ON state, the second resistor R12 functions, and the low-pass filter 19a can be hence regarded as the second low-pass filter which is constituted by the parallel connection of the first resistor R11 with the second resistor R12 and the capacitor C10 and operates in accordance with the second time constant. The first time constant is so set as to sufficiently smooth the control voltage herein. This setting is used because insufficient smoothing of the control voltage may result in the unfixed control voltage leading to the unstable control loop, the divergent control loop or the deterioration in quality of a line being used for transmission.

Figure 3:
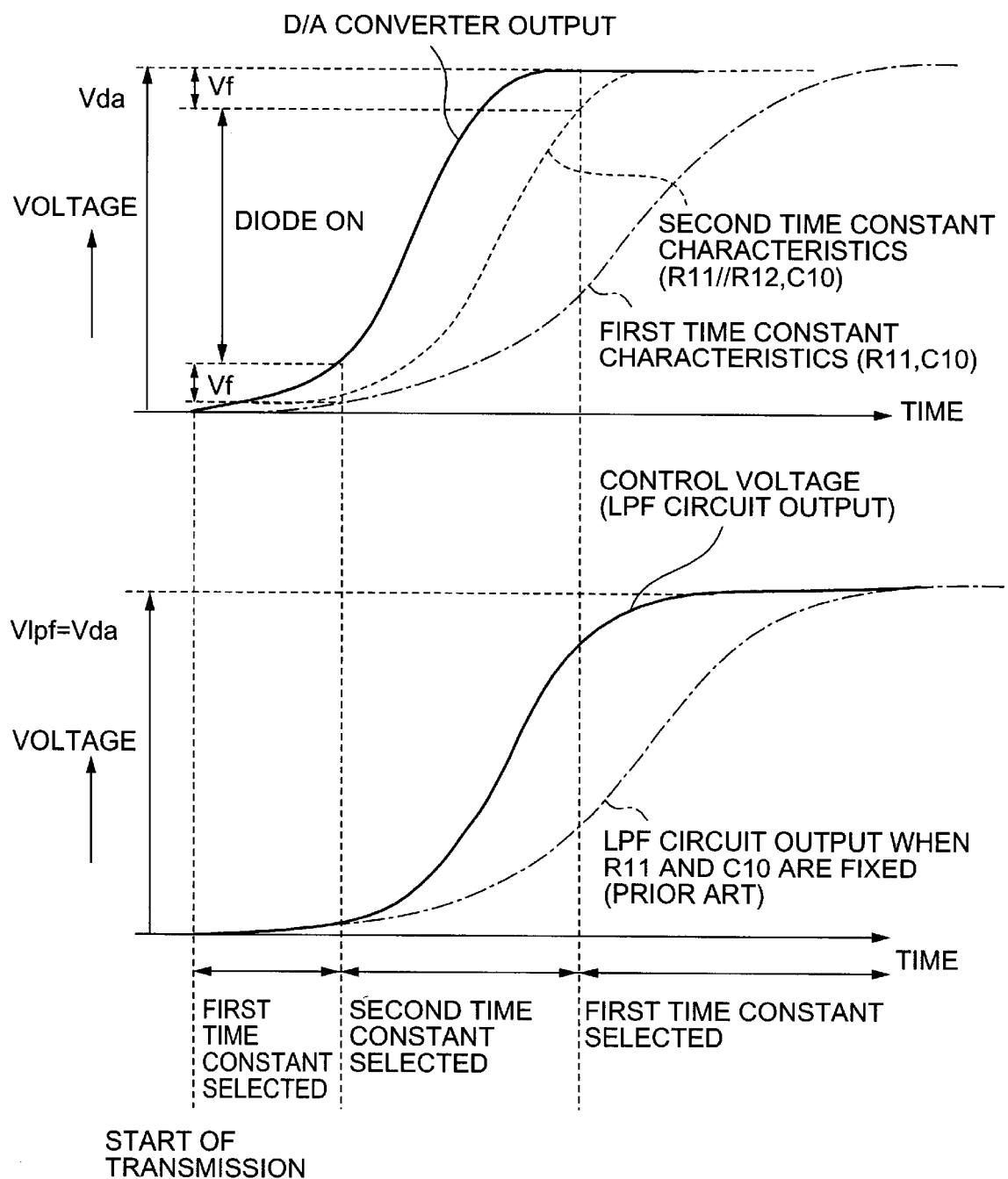
FIG. 3 is a view showing output waveforms of a D/A converter and the low-pass filter included in the power control apparatus according to the embodiment 1 of the present invention.

Referring to FIG. 3, the operation of the power control apparatus according to the embodiment 1 will now be described.

A waveform of a first transition of an output voltage from the D/A converter 18 is indicated by a solid curve in an upper graph of FIG. 3. Here, Vda represents a value of the output voltage from the D/A converter 18 that varies in accordance with the code setting from the CPU 16. Vf symbolizes an ON voltage in the forward direction of the diode; and Vlpf, a value of the output voltage from the low-pass filter 19a. An alternate long and short dash curve in the upper graph of FIG. 3 indicates the first time constant characteristics, namely, the time constant characteristics of the first low-pass filter constituted by the first resistor R11 and the capacitor C10, and a broken curve indicates the second time constant characteristics, i.e., the time constant characteristics of the second low-pass filter constituted by the parallel connection of the first and second resistors R11 and R12 and the capacitor C10.

When the output from the D/A converter 18 is indicated by the solid curve in the upper graph of FIG. 3 as described above, the output from the low-pass filter 19a, i.e., the control voltage which is the output from the low-pass filter circuit 19 changes as indicated by the solid curve in the lower graph of FIG. 3. Specifically, when transmission starts, the output voltage from the D/A converter 18 shows its first transition and, at this point in time, the diode D10 is in the OFF state with the voltage applied to the both ends of the diode D1 being in the range of not more than Vf, and the low-pass filter 19a functions as the first low-pass filter constituted by the first resistor R11 and the capacitor C10. Thus, the control voltage varies in the waveform indicated by the alternate long and short dash curve in the upper graph of FIG. 3. The time constant therefore becomes large while the diode D10 is in the OFF state, whereby the control voltage takes the waveform that gradually rises.

Meanwhile, when the voltage applied to the both ends of the diode exceeds Vf, the diode D10 is turned to the ON state. Thus, the low-pass filter 19a functions as the second low-pass filter constituted by the parallel connection of the first and second resistors R11 and R12 and the capacitor C10, and the control voltage varies in the waveform indicated by the broken curve in the upper graph of FIG. 3. The time constant therefore becomes small, whereby the control voltage takes the voltage waveform that shows the sudden rise.

Further, when the control voltage approximates Vda, the voltage applied to the both ends of the diode D10 becomes equal to or less than Vf and the diode D10 enters the OFF state. As a result, the low-pass filter 19a again functions as the first low-pass filter constituted by the first resistor R11 and the capacitor C10, and the control voltage changes back into the waveform indicated by the alternate long and short dash curve in the upper graph of FIG. 3. Therefore, when the control voltage approximates Vda, the time constant becomes large and the control voltage again takes the gradually-rising waveform.

Figure 4:
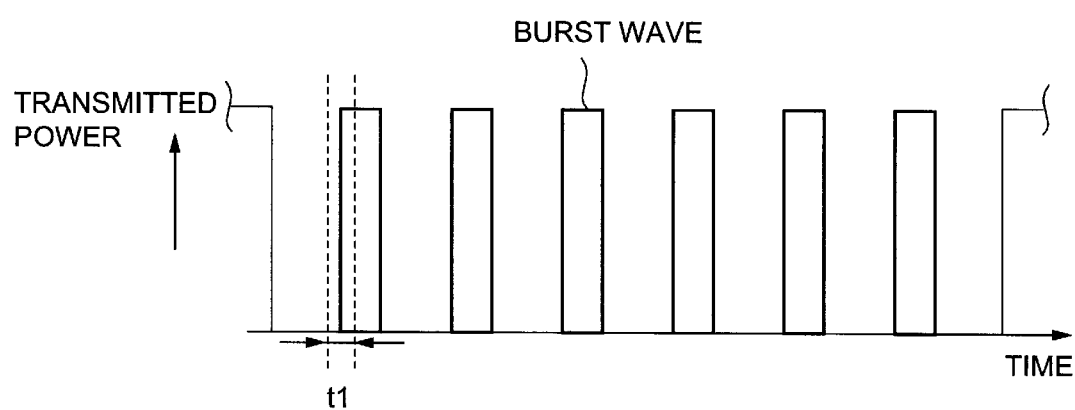
FIG. 4 is a view showing a transmitted power waveform obtained when the power control apparatus according to the embodiment 1 of the present invention is applied to a portable radio communication apparatus adopting TDMA.
Figure 5:
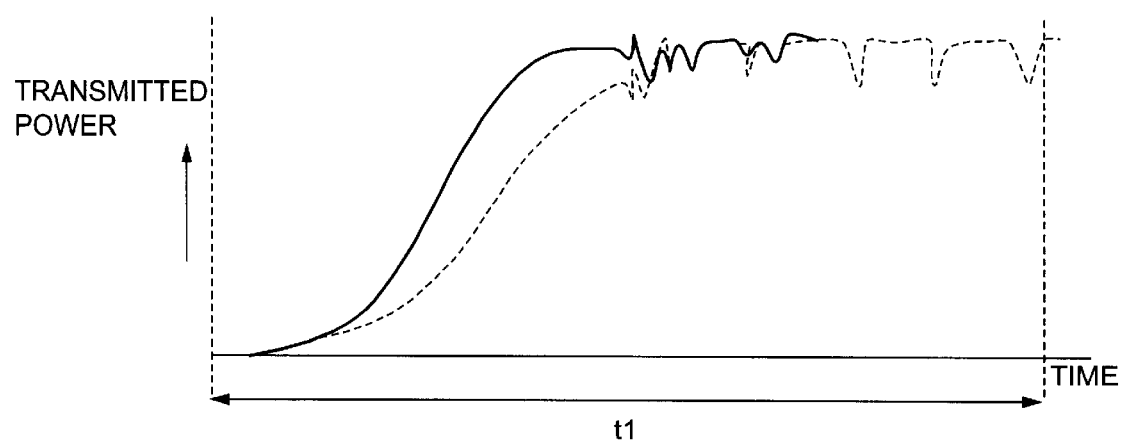
FIG. 5 is a view showing a partially-enlarged transmitted power waveform illustrated in FIG. 4.

FIG. 4 is a graph showing the waveform of the transmitted power from a portable radio communication apparatus adopting TDMA. When employing the apparatus according to the first embodiment as the power control apparatus for this radio communication apparatus, the transmitted power waveform at a first transition of the burst wave is as shown in FIG. 5. A solid curve in FIG. 5 represents an enlarged transmitted power waveform in a section t1 in FIG. 4. Additionally, in FIG. 5, a broken curve shows a transmitted power waveform in case of adopting a conventional low-pass filter aiming at smoothing and stabilizing the output voltage from the D/A converter for the purpose of comparison. As apparent from FIG. 5, when the apparatus for the transmitted power according to the embodiment 1 is adopted, the modulated waveform of the transmitted power at a leading edge after start of transmission rises without a collapse. on the other hand, when using the prior art low-pass filter indicated by the broken line, it is evident from FIG. 5 that the rising waveform of the transmitted power slacks and the leading edge of the transmitted waveform collapses.

According to the power control apparatus of the above-described embodiment 1, since the low-pass filter 19a is caused to operate in accordance with the small second time constant at the first transition of the transmitted power and operate in accordance with the large first time constant after the first transition of the transmitted power, the rapid rise of the control voltage can be obtained while assuring smoothing of the output voltage from the D/A converter 18 and stabilization of the control loop which are the primary object of the low-pass filter, thereby realizing the automatic control of the stable transmitted power without slack of the first transition of the transmitted power.

In addition, the changeover between the first time constant and the second time constant can be realized by the simple circuit structure including only the second resistor R12 and the diode D10, reducing the scale of the circuit.

Embodiment 2

Figure 6:
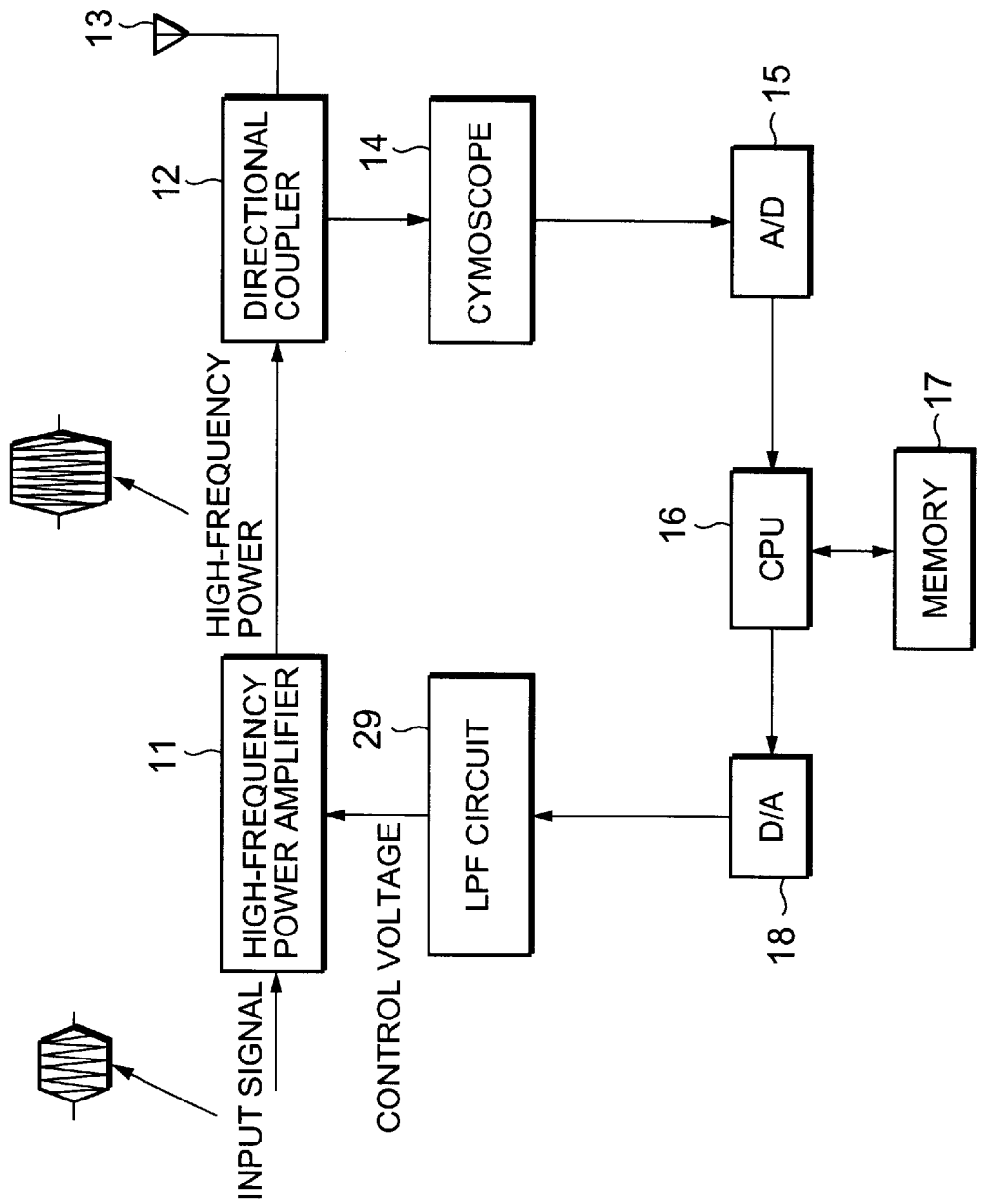
FIG. 6 is a block diagram showing the structure of a power control apparatus according to an embodiment 2 of the present invention.
Figure 7:
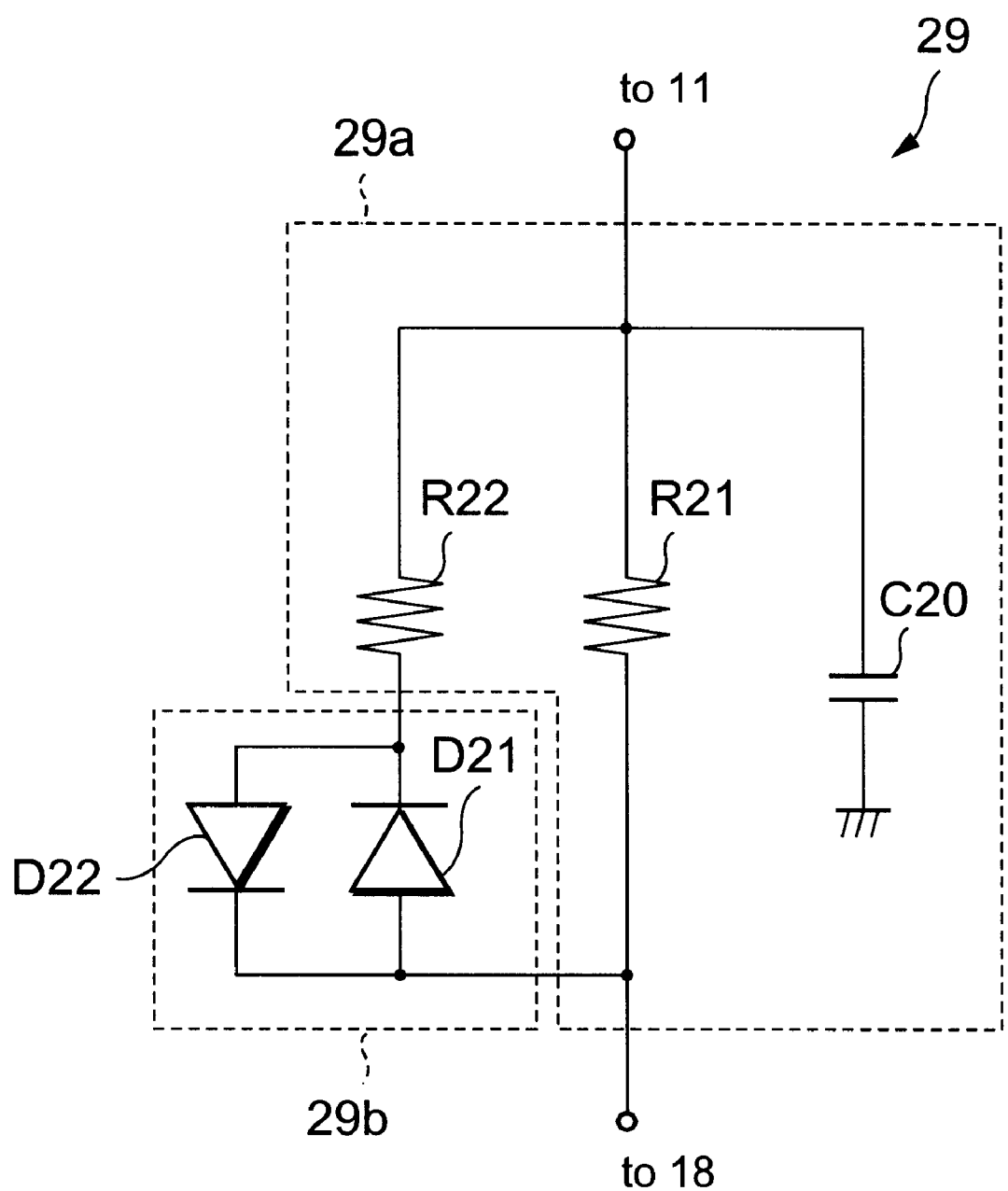
FIG. 7 is a circuit diagram showing a low-pass filter included in the power control apparatus according to the embodiment 2 of the present invention.

An embodiment 2 of the power control apparatus according to the present invention will now be described with reference to FIGS. 6 to 8. In order to avoid the tautological description, reference numerals in the embodiment 1 denote like or corresponding structures in the embodiment 2 which are the same with those in the embodiment 1, thereby omitting their explanation. A low-pass filter circuit 29 shown in FIG. 6 substitutes for the low-pass filter 19 illustrated in FIG. 1, and other constituent parts in FIG. 6 are similarly constituted as those in FIG. 1. Referring to FIG. 7, the low-pass filter circuit 29 is constituted by a low-pass filter 29a and a filter control circuit 29b.

The low-pass filter 29a operates in accordance with either a first time constant or a second time constant smaller than the first time constant as similar to the low-pass filter 19a shown in FIG. 2 and filters the control voltage generated by the D/A converter 18 to be supplied to the high-frequency amplifier 11.

On the other hand, the filter control circuit 29b causes the low-pass filter 29a to operate in accordance with the second time constant at the first transition of the transmitted power and causes the low-pass filter 29a in accordance with the first time constant after the first transition of the transmitted power as similar to the low-pass filter 19a of the embodiment 1 shown in FIG. 2. Further, in the embodiment 2, the filter control circuit 29b causes the low-pass filter 29a to operate in accordance with the first time constant before the last transition of the transmitted power and causes the low-pass filter 29a to operate in accordance with the second time constant at the last transition of the transmitted power.

More particularly, the low-pass filter 29a is constituted by a first resistor R21, a capacitor C20 having the first time constant in cooperation with the first resistor R21 and a second resistor R22 which is connected in parallel to the first resistor R21. The filter control circuit 29b includes two diodes D21 and D22 which are connected to the second resistor R22 of the low-pass filter 29a in series. The diodes D21 and D22 are connected in parallel to each other in opposite directions, and the diode D21 functions as similar to the diode D10 shown in FIG. 2, thereby omitting the explanation of the diode D21 herein.

In this example, since the second resistor R22 does not function when the diode D22 is in the OFF state, the low-pass filter 29a is constituted by the first resistor R21 and the capacitor C20. In this case, the low-pass filter 29a can be regarded as the first low-pass filter which operates in accordance with the first time constant. On the other hand, since the second resistor R22 functions when the diode D22 is in the ON state, the low-pass filter 29a is constituted by the parallel connection of the first resistor R21 and the second resistor R22 and the capacitor C20. In such a case, the low-pass filter 29a can be regarded as the second low-pass filter which operates in accordance with the second time constant.

Description will now be given as to the power control apparatus according to the embodiment 2 with reference to FIG. 8.

Figure 8:
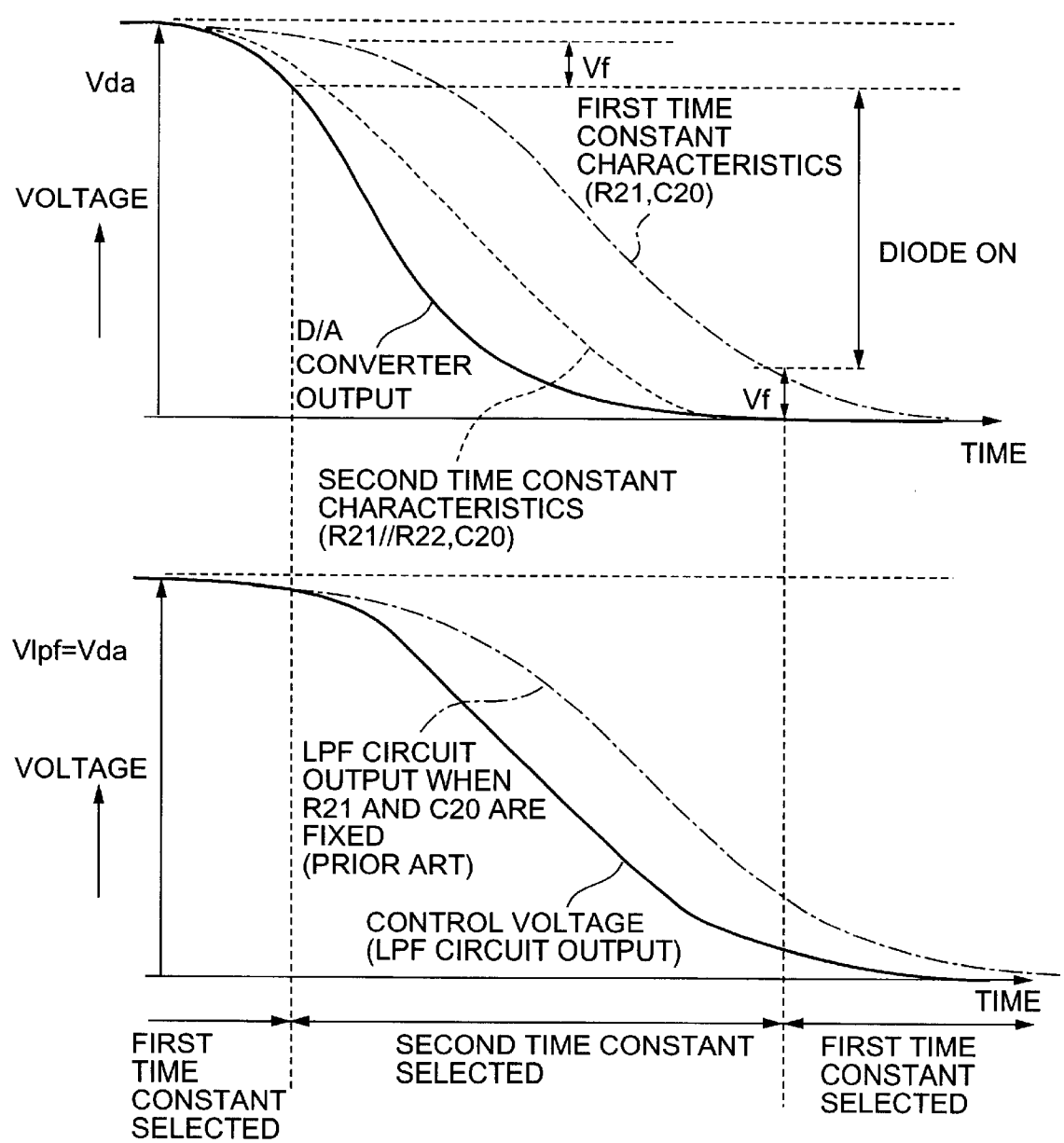
FIG. 8 is a view showing output waveforms of a D/A converter and the low-pass filter included in the power control apparatus according to the embodiment 2 of the present invention.

The waveform of the output voltage from the D/A converter at the last transition can be indicated by a solid curve in the upper graph in FIG. 8. Vf represents an ON voltage of the diodes D21 and D22 in the forward direction. Further, an alternate long and short dash curve in FIG. 8 indicates time constant characteristics of the first low-pass filter constituted by the first resistor R21 and the capacitor C20, and a broken curve indicates time constant characteristics of the second low-pass filter constituted by the parallel connection of the first and second resistors R21 and R22 and the capacitor C20.

When the output from the D/A converter 18 can be indicated by the solid curve in the upper graph in FIG. 8 as described above, the output from the low-pass filter 29a, i.e., the control voltage which is the output from the low-pass pass filter circuit 19 varies as indicated by a solid curve in the lower graph in FIG. 8. Particularly, when a difference between the control voltage and the voltage discharged in accordance with the time constant determined by the first resistor R21 and the capacitor C20 is less than Vf, the both diodes D21 and D22 are in the OFF state, and. the low-pass filter 29a operates as the first low-pass filter, namely, it operates in accordance with the first time constant, whereby the output from the low-pass filter circuit 29 shows the gradual fall.

On the other hand, when a difference between the discharged voltage and the control voltage is not less than Vf, the diode D22 is turned to the ON state, and the low-pass filter 29a operates as the second low-pass filter, namely, it operates in accordance with the second time constant, whereby the output from the low-pass filter circuit 29 shows the rapid fall. In this state, the reverse voltage is applied to the both ends of the diode D21, and hence the diode D21 remains in the OFF state.

Additionally, when the control voltage lowers the voltage discharged in accordance with the parallel connection of the first and the second resistors R21 and R22 and the capacitor C20 becomes less than Vf, the diode D22 is turned off, and the low-pass filter 29a operates as the first low-pass filter, namely, it operates in accordance with the first time constant, again involving the gradual fall of the output from the low-pass filter circuit 29. Although not explained herein, it is not needless to say that the power control apparatus according to the embodiment 2 operates in the fashion similar to that shown in FIG. 3 even at the first transition of the transmitted power owing to the diode D21. In addition, when the rapid rise of the control voltage is not necessary, the filter control circuit 29b may be constituted without providing the diode D21.

According to the power control apparatus of the embodiment 2, the following advantages can be obtained in addition to those in the foregoing embodiment 1. Since the low-pass filter 29a is caused to operate in accordance with the large first time constant before the last transition of the transmitted power and operate in accordance with the small second time constant at the last transition of the transmitted power in the embodiment 2, the rapid fall of the control voltage can be obtained while performing smoothing of the output voltage from the D/A converter 18 and stabilization of the control loop which are the primary purpose of the low-pass filter. Thus, the automatic control of the stable transmitted power can be realized without the slack of the last transition of the transmitted power.

Moreover, the simple circuit structure only using the second resistor R12 and the diode D22 can realize switching between the first time constant and the second time constant at the last transition of the control voltage, thereby reducing the scale of the circuit.

Embodiment 3

An embodiment 3 of the power control apparatus according to the present invention will now be demonstrated with reference to FIGS. 9 to 12. It is to be noted that reference numerals which are the same with those in the embodiment 1 shown in FIG. 1 are given to like or corresponding parts in the embodiment 3 in order to avoid the tautological explanation.

Figure 9:
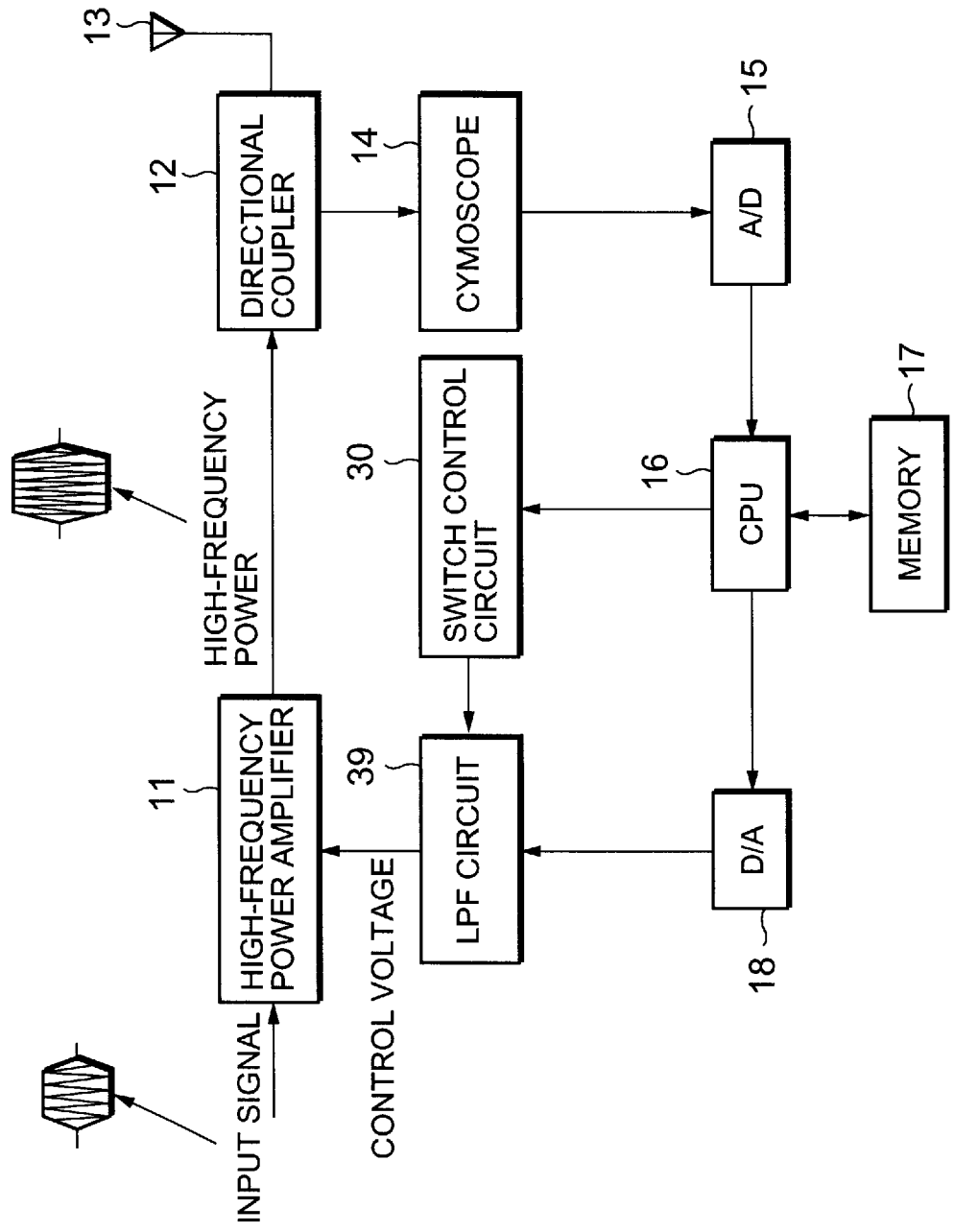
FIG. 9 is a block diagram showing the structure of a power control apparatus according to an embodiment 3 of the present invention.
Figure 10:
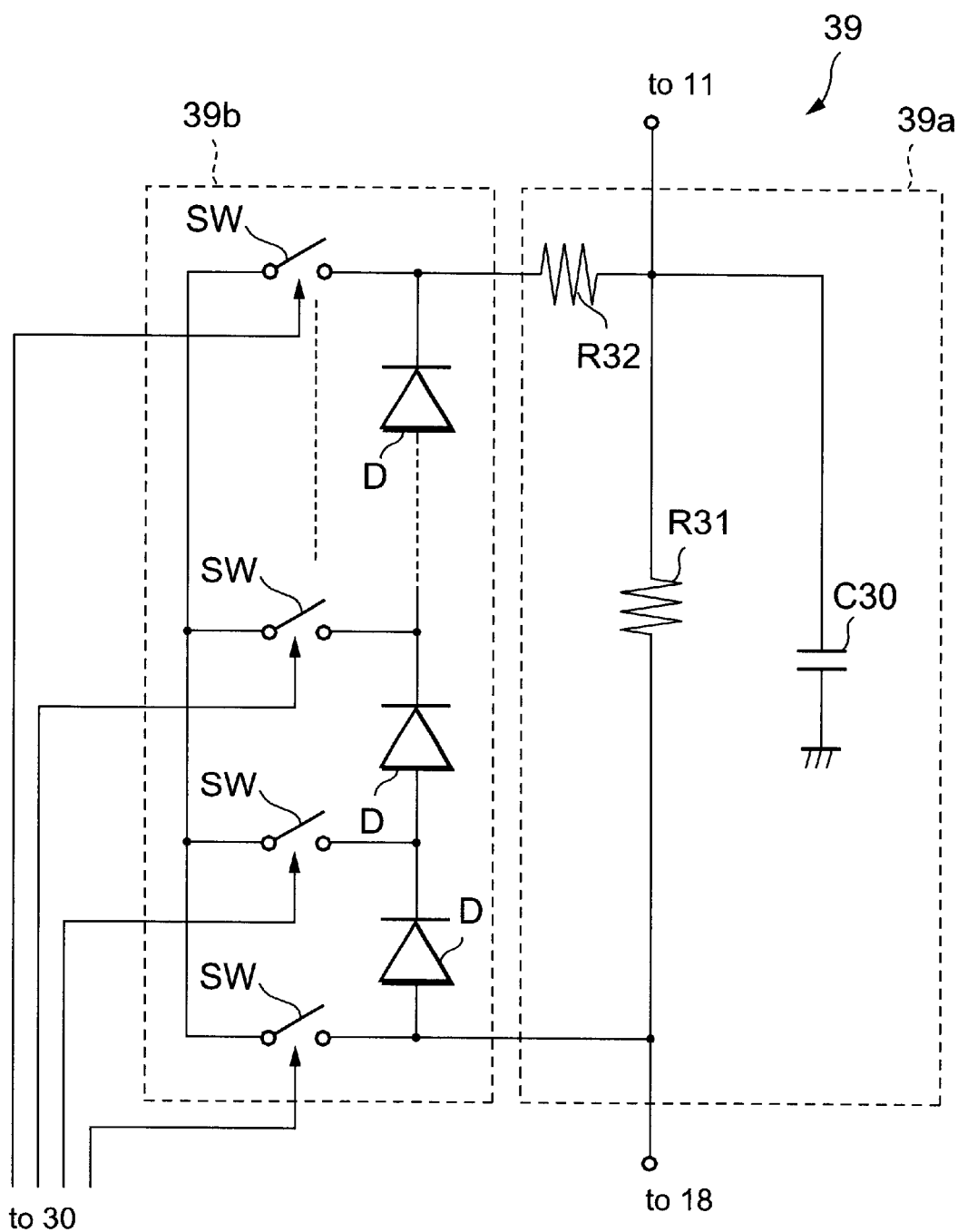
FIG. 10 is a circuit diagram of a low-pass filter circuit included in the power control apparatus according to the embodiment 3 of the present invention.

The power control apparatus shown in FIG. 9 includes a low-pass filter 39 which substitutes for the low-pass filter circuit 19 of the embodiment 1 shown in FIG. 1 and a switch control circuit 30. The detailed structure of the low-pass filter circuit 39 is illustrated in FIG. 10, and the low-pass filter circuit 39 is provided with a low-pass filter 39a and a filter control circuit 39b.

The low-pass filter 39a operates in accordance with either a first time constant or a second time constant smaller than the first time constant and filters the control voltage generated by the D/A converter 18 to be supplied to the high-frequency power amplifier 11. Specifically, the low-pass filter 39a includes: a first resistor R31; a capacitor C30 which cooperates with the first resistor R31 to form a first low-pass filter having the first time constant; and a second resistor R32 which is connected in parallel to the first resistor R31 and cooperates with the first resistor R31 and the capacitor C30 to form a second low-pass filter having the second time constant.

The filter control circuit 39b has a plurality of diodes D connected to the second resistor R32 in series and also includes a plurality of switches SW which enable the connection between each of these diodes D and the second resistor R32 or disable it by short-circuiting. Each switch SW is controlled by a switch control circuit 30 shown in FIG. 9. This switch control circuit 30 selects the diode D to be effectively connected to the second resistor R32 by controlling ON/OFF of each switch SW based on a command from the CPU 16.

As similar to the above embodiment 1, in the power control apparatus according to the embodiment 3 having the above arrangement, the low-pass filter 39a can be caused to operate in accordance with the second time constant at the first transition of the transmitted power and the low-pass filter 39a can be caused to operate in accordance with the first time constant after the first transition of the transmitted power.

Figure 11:
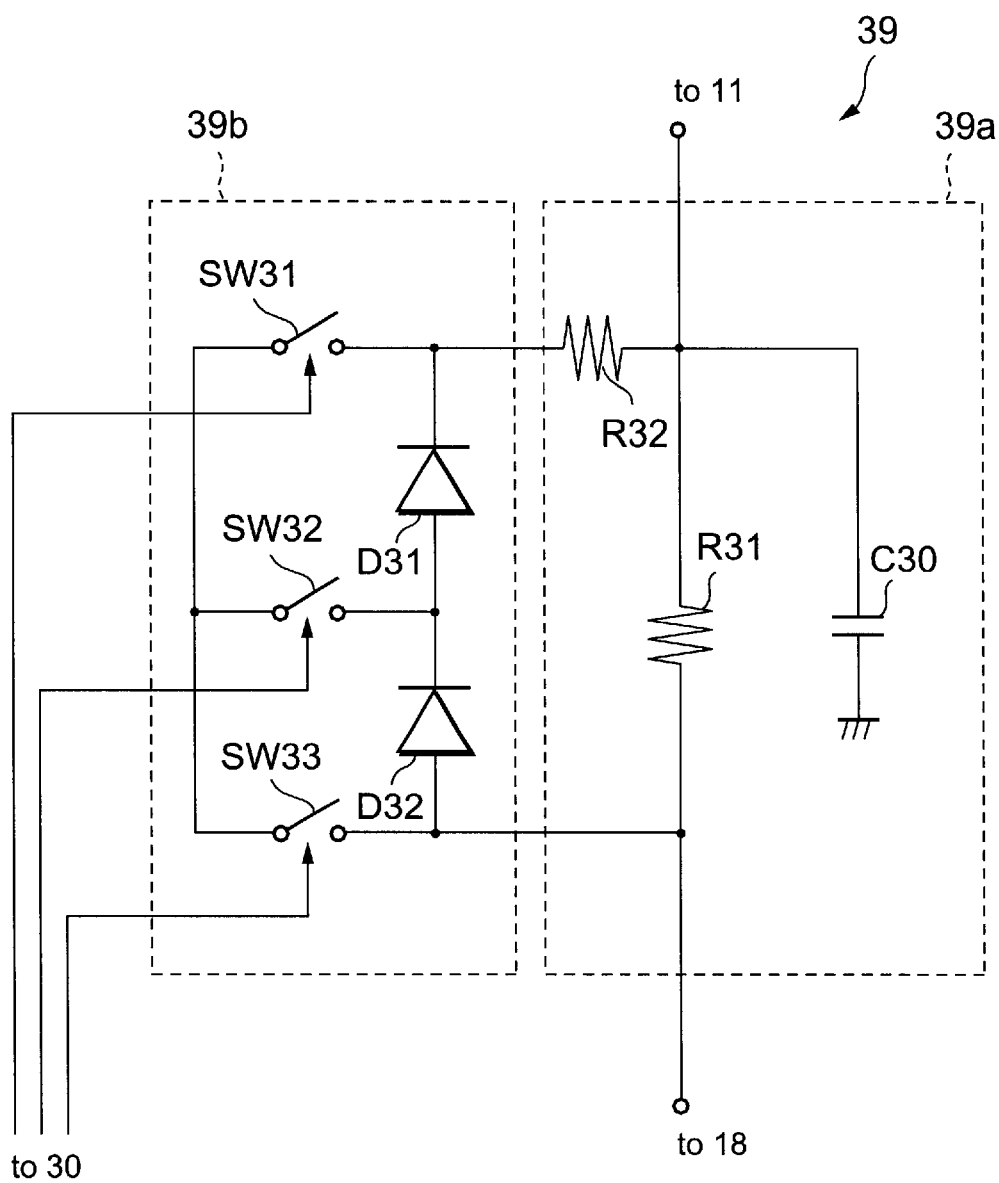
FIG. 11 is a circuit diagram schematically showing the low-pass filter circuit illustrated in FIG. 10 for brief explanation of the operation.

The timing for switching the first and second time constants for the low-pass filter 39a can be changed based on how to select enabling or disabling of each diode D. FIG. 11 shows an example where a plurality of diodes D shown in FIG. 10 includes first and second diodes D31 and D32 and the switches SW includes first, second and third switches SW1, SW2 and SW3.

For example, assuming that the diodes D31 and D32 shown in FIG. 11 are equal to the diode D10 illustrated in FIG. 2, the diode D31 is enabled and the diode D32 is disabled when the switch SW31 is turned off and the switches SW32 and SW 33 are turned on, and the timing for switching the first and second time constants for the low-pass filter 39a is hence equal to that for the low-pass filter 19a depicted in FIG. 2.

Figure 12:
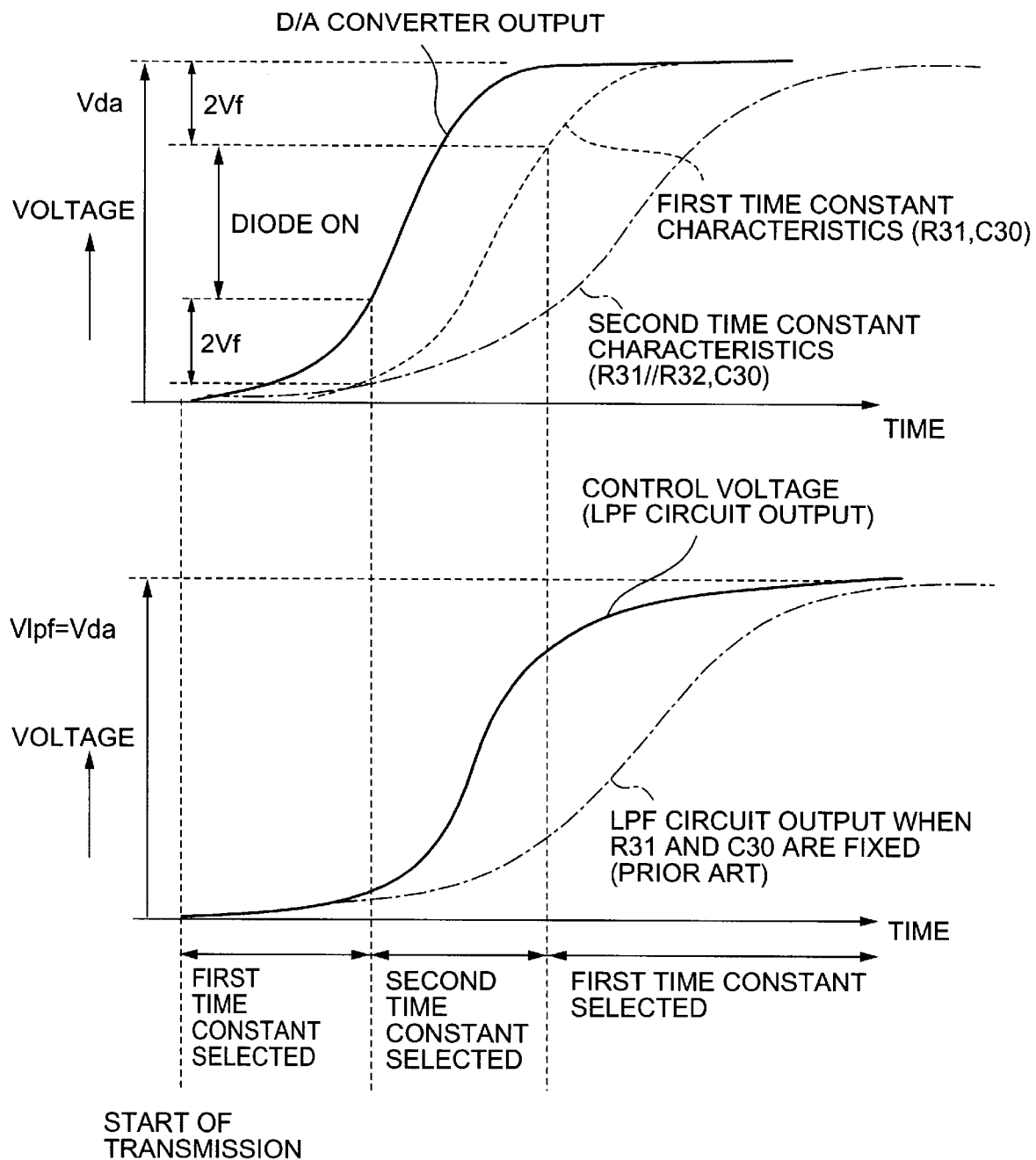
FIG. 12 is a view showing output waveforms of a D/A converter and a low-pass filter included in the power control apparatus according to the embodiment 3 of the present invention.

On the other hand, when the switches SW31, SW32 and SW33 are all turned off, the both the diodes D31 and D32 are enabled, resulting in a change in timing for switching the first and second time constants for the low-pass filter 39a. Particularly, since the series connection between the diodes D31 and D32 is effectively connected to the second resistor R32 in series, the ON voltage of the diodes D31 and D32 becomes 2 Vf which is double the ON voltage Vf shown in FIG. 3 as illustrated in FIG. 12. Therefore, the timing for switching the first time constant to the second time constant in the example shown in FIG. 12 becomes slower than that illustrated in FIG. 3 but the timing for changing the second time constant back to the first time constant becomes faster than that depicted in FIG. 3.

It is to be noted that the types of the diodes D included in the filter control circuit 39b do not have to be the same and various kinds of diode may be combined to be used. Of course, the ON voltages may differ depending on the respective diodes D. Further, a reverse diode which is connected in parallel to each diode shown in FIG. 10 may be added as similar to the foregoing embodiment 2, or each diode illustrated in FIG. 10 may be reversed. By doing so, the last transition characteristics of the control voltage may be improved.

The advantages similar to those of the above-mentioned embodiment 1 can be obtained according to the power control apparatus of the embodiment 3, and the following advantages can be further acquired. By the changeover of the switch SW, variations in numbers of diodes connected to the second resistor R32 can change the timing for switching the first and second time constants. As a result, even if the rising speed of the transmitted power is uneven due to inequable production of the power amplifier and the like, adjustment of the timing for switching the time constants can absorb the unevenness due to the spotty product quality.

Embodiment 4

Figure 14:
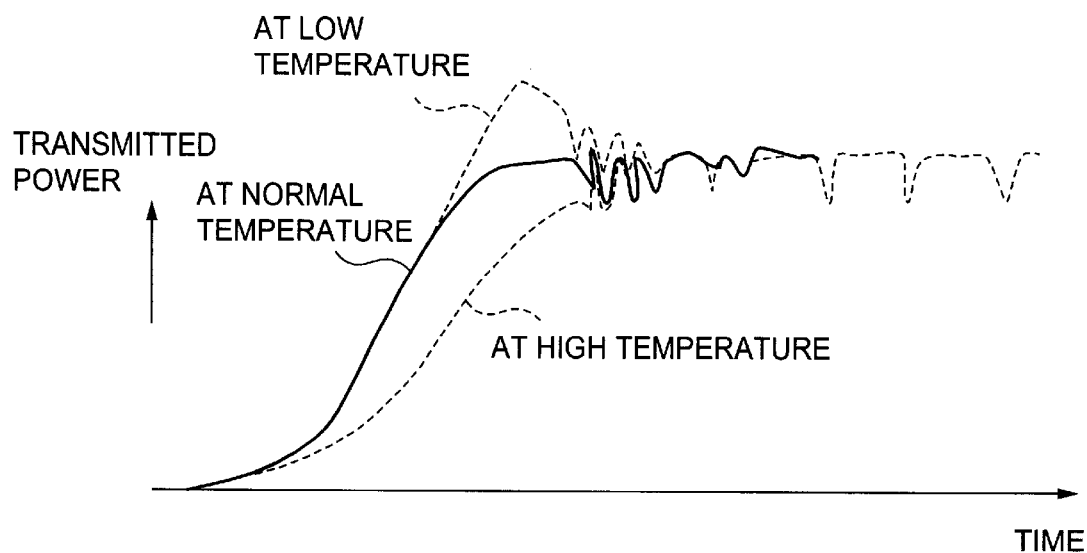
FIG. 14 is a view showing changes in a transmitted power waveform caused due to changes in temperature in a general portable radio communication apparatus adopting TDMA.
Figure 15:
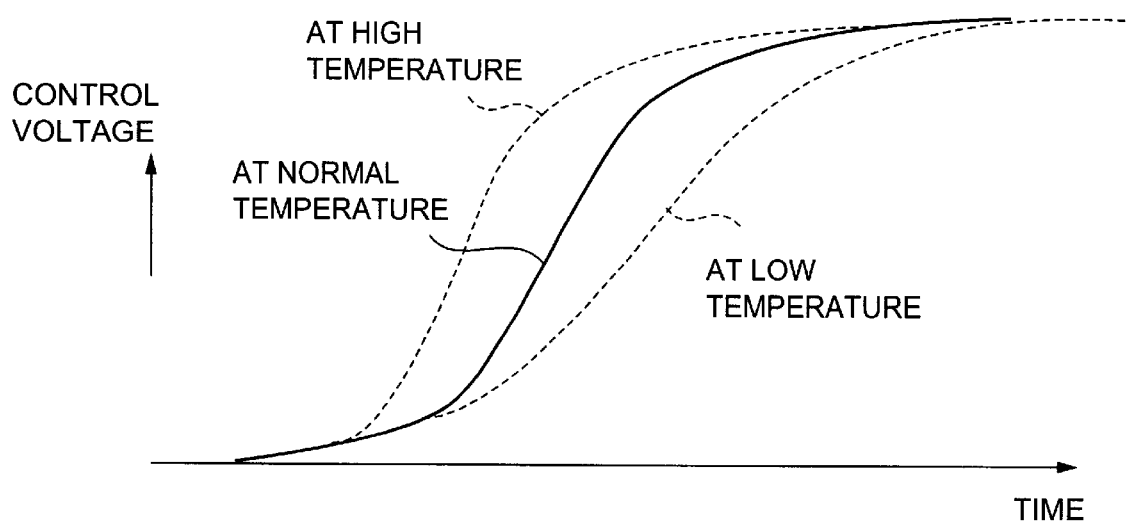
FIG. 15 is a view showing output waveforms of a lowpass filter circuit for controlling a waveform in a first transition of an output voltage when a temperature of the power control apparatus according to the embodiment 4 of the present invention changes.

An embodiment 4 of the power control apparatus according to the present invention will now be described with reference to FIGS. 13 to 15. In order to avoid tautological explanation, reference numerals similar to those in the embodiment 3 shown in FIG. 9 are given to like or corresponding parts in the embodiment 4, thereby omitting the description thereof.

Figure 13:
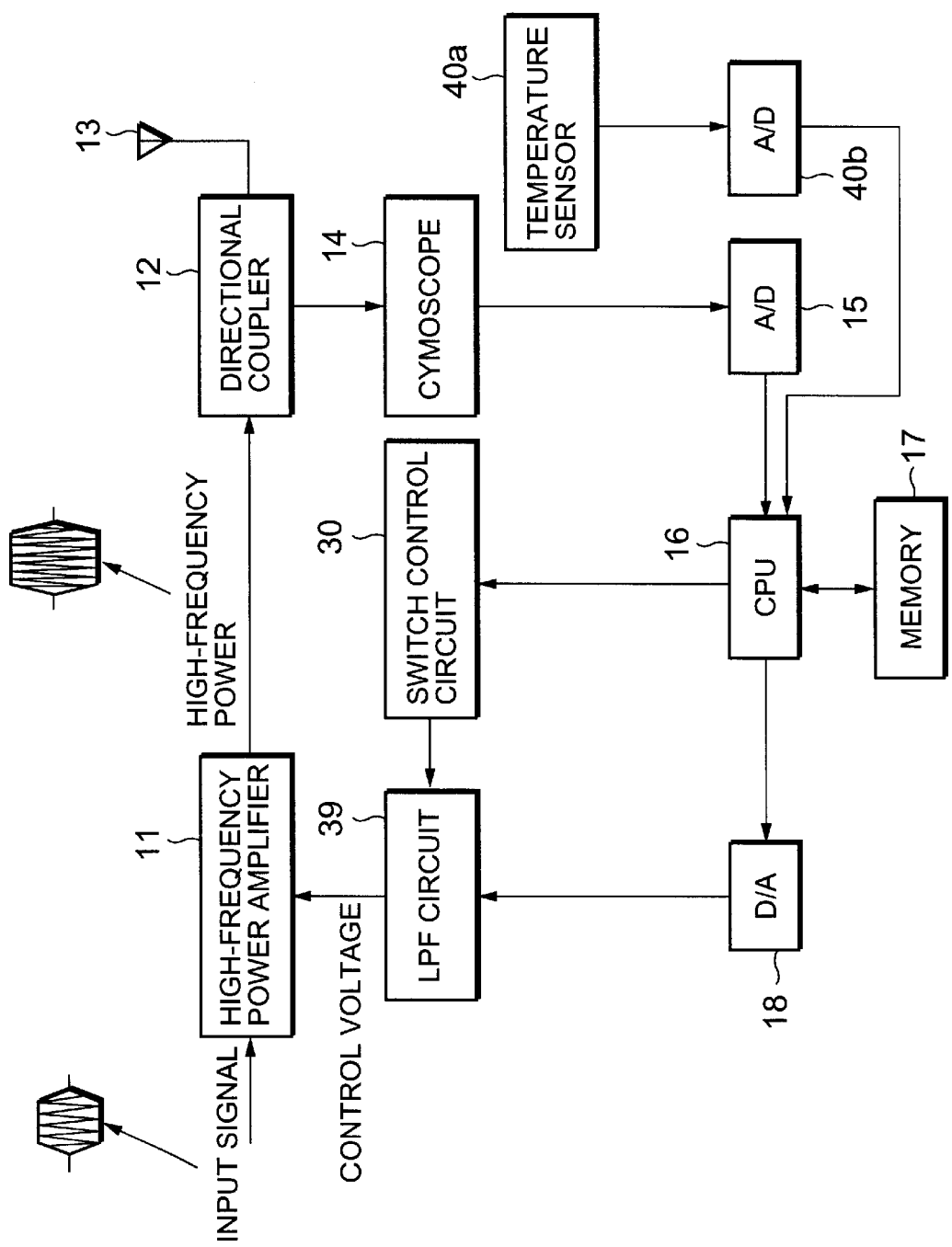
FIG. 13 is a block diagram showing the structure of a power control apparatus according to an embodiment 4 of the present invention.

In addition to the structure of the embodiment depicted in FIG. 9, the power control apparatus shown in FIG. 13 further includes a temperature sensor 40a and an A/D converter 40b. The temperature sensor 40a detects an ambient temperature of the power control apparatus. The A/D converter 40b converts an output voltage from the temperature sensor 40a into a digital code. The memory 17 stores a later-described temperature correction memory table for specifying a diode to be connected to the second resistor. The digital code from the A/D converter 40b is inputted, the CPU 16 selects a diode which is to be effectively connected to the second resistor and informs the switch control circuit 30 of the selection by making reference to the temperature correction memory table in the memory 17.

The power control apparatus according to the embodiment 4 is effective when the first transition of the power amplifier varies due to a change in temperature. Specifically, as shown in FIG. 14, when the first transition of the transmitted power overshoots at a low temperature and undershoots at a high temperature, the switch is so controlled as to increase a number of diodes to be connected to the second resistor in series at the low temperature, and the control voltage characteristics having the slack leading edge, e.g., the control voltage characteristic at the low temperature shown in FIG. 15 are obtained. Meanwhile, when the first transition undershoots at the high temperature, the switch is so controlled as to decrease a number of diodes to be connected to the second resistor in series, and the control voltage characteristics having the sharp leading edge, e.g., the control voltage characteristics at the high temperature shown in FIG. 15 are obtained.

According to the embodiment 4, the following advantages can be obtained as well as those of the embodiment 3. That is, the rising characteristics of the transmitted power can be maintained at a constant state even if the first transition of the power amplifier varies due to a change in temperature.

Further, addition of a reverse diode connected in parallel to each diode or substitution of a reverse diode for each diode are possible likewise in the embodiment 4 and, in this case, the falling characteristics of the transmitted power can be maintained at a constant state even if a change in temperature occurs.

Embodiment 5

An embodiment 5 of the power control apparatus according to the present invention will now be described with reference to FIG. 16. A low-pass filter circuit 59 shown in FIG. 16 substitutes for the low-pass filter circuit 39 of the embodiment 3 or 4 shown in FIG. 9 or 13.

Figure 16:
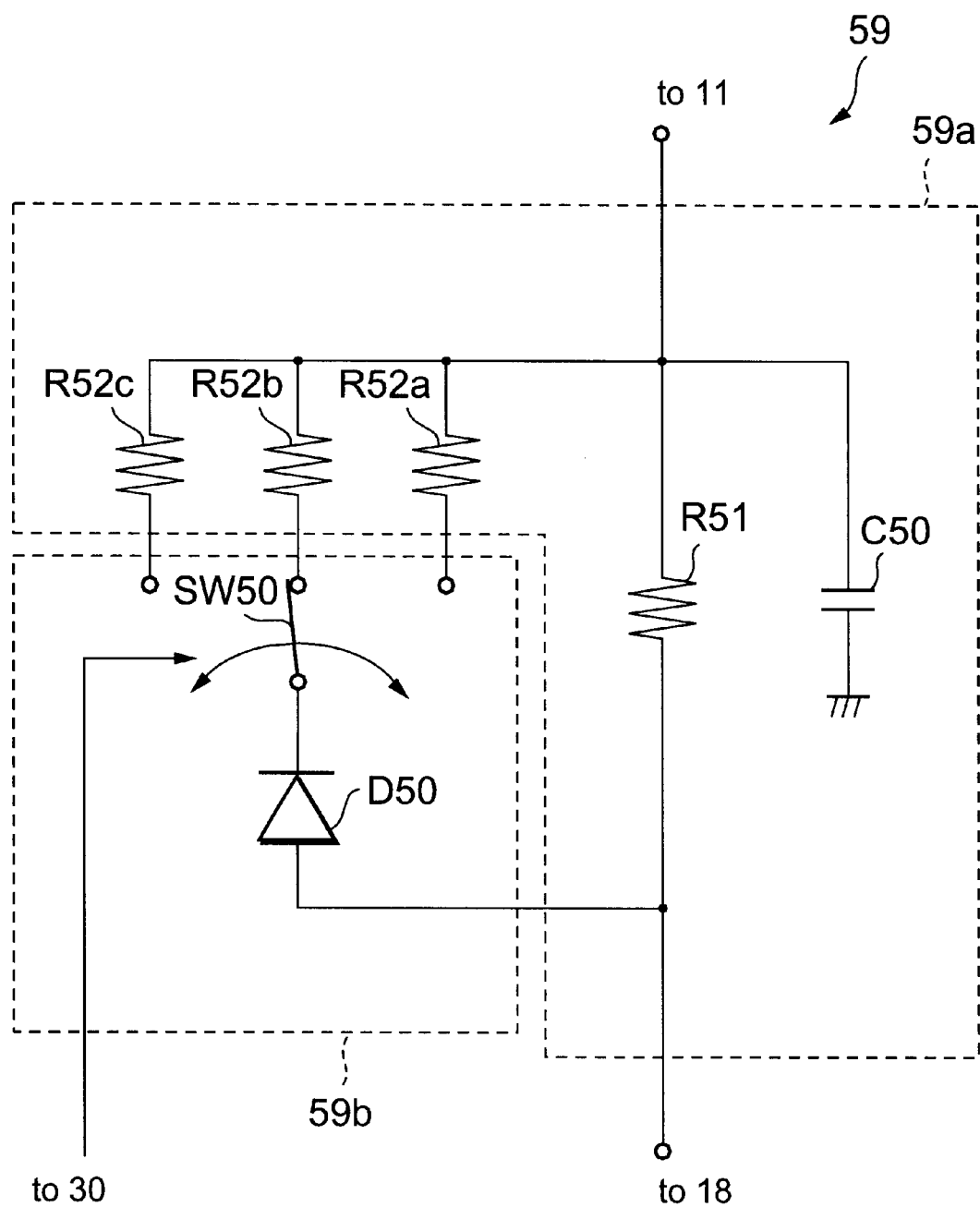
FIG. 16 is a circuit diagram showing a low-pass filter circuit partially constituting a power control apparatus according to an embodiment 5 of the present invention.

As illustrated in FIG. 16, the low-pass filter circuit 59 is provided with a low-pass filter 59a and a filter control circuit 59b. The low-pass filter 59a includes: a first resistor R51; a capacitor C50 which cooperates with the first resistor R51 to form a low-pass filter having a first time constant; and a plurality of second resistors R52a, R52b and R52c which are connected in parallel to the first resistor and respectively cooperate with the first resistor R51 and the capacitor C50 to form a second low-pass filter that operates in accordance with a second time constant. The filter control circuit 59b has: a diode D50 which is in series to each of the second resistors R52a, R52b and R52c; and a switch SW50 for selectively connecting the multiple second resistors R52a, R52c and R52c to the diode D50 in series.

In the power control apparatus according to the embodiment 5, the second time constant can vary due to a change in resistance value, whereas the rising characteristics of the transmitted power are changed based on a number of diodes in the embodiments 3 and 4. Therefore, advantages similar to those in the embodiments 3 and 4 can be obtained by appropriately setting a resistance value of each of the multiple second resistors R52a, R52b and R52c and properly changing over the switch SW50.

Further, a reverse diode can be added to each diode in parallel and a reverse diode can substitute for each diode likewise in the embodiment 5 and, in such a case, the falling characteristics of the transmitted power can be maintained at a constant state even if a change in temperature occurs.

Embodiment 6

Figure 17:
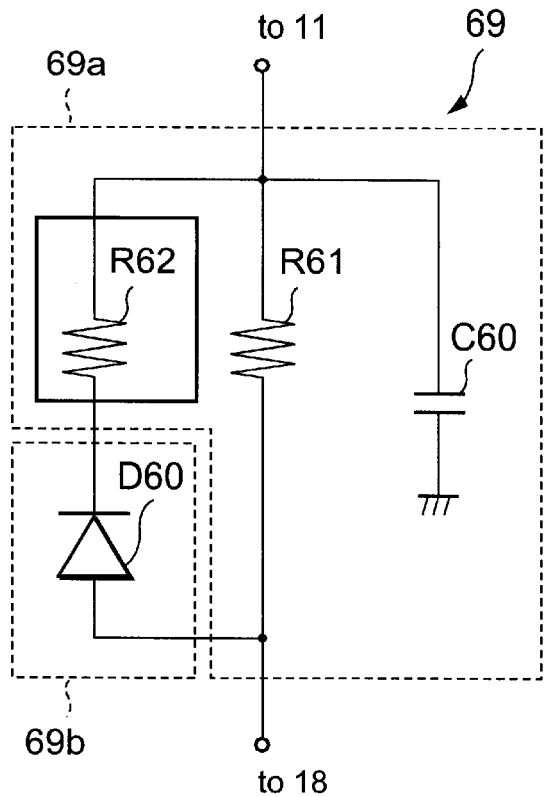
FIG. 17 is a circuit diagram showing a low-pass filter circuit partially constituting a power control apparatus according to an embodiment 6 of the present invention.

An embodiment 6 of the power control apparatus according to the present invention will now be described with reference to FIG. 17. A low-pass filter circuit 69 shown in FIG. 17 substitutes for the low-pass filter 19 illustrated in FIG. 1. The low-pass filter circuit 69 has a low-pass filter 69a and filter control means 69b. The low-pass filter 69 is provided with a first resistor R61, a second resistor R62 and a capacitor C60. The first resistor R61 and the capacitor C60 are the same with the first resistor R11 and the capacitor C10 shown in FIG. 2, but the second resistor R62 is different from the second resistor R12 depicted in FIG. 2 and constituted by a thermistor and the like. Therefore, in this embodiment, the second resistor R62 has a function as a temperature sensor and that for changing the second time constant in accordance with a temperature as well as a function for providing the second time constant.

Accordingly, advantages similar to those in the embodiment 5 can be obtained in the embodiment 6 by appropriately setting the (temperature-resistance) characteristics. In addition, the power control apparatus can be provided by the structure which is more simple as compared with that in the embodiment 5.

Further, addition of a reverse diode connected in parallel to each diode and substitution of a reverse diode for each diode are possible in the embodiment 6 and, in this case, the falling characteristics of the transmitted power can be maintained at a constant state even if a temperature changes.

Embodiment 7

Figure 18:
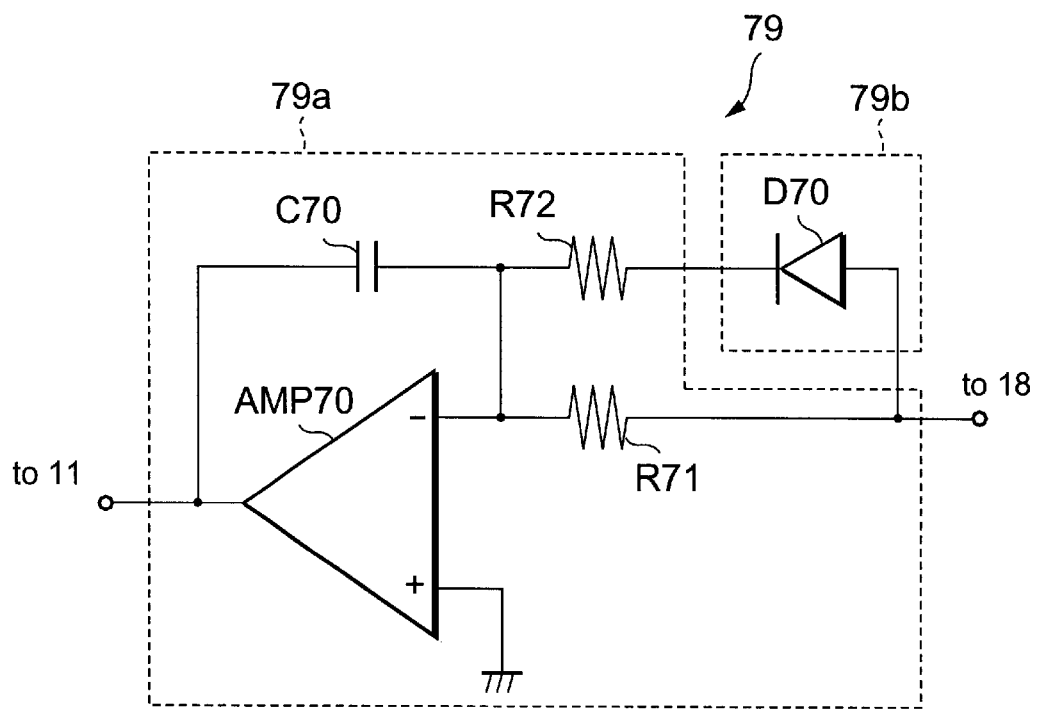
FIG. 18 is a circuit diagram showing a low-pass filter circuit partially constituting a power control apparatus according to an embodiment 7 of the present invention.
Figure 19:
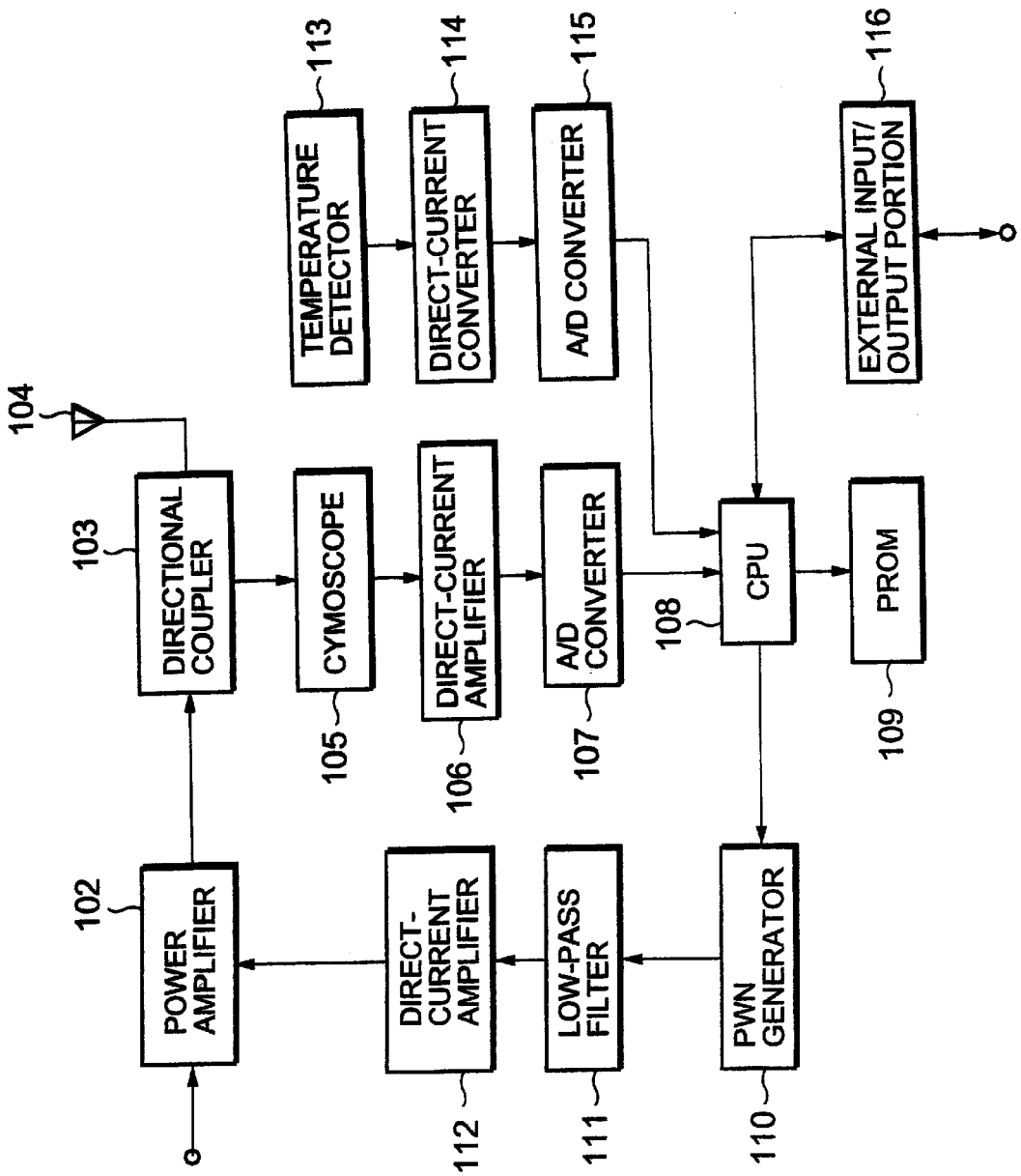
FIG. 19 is a block diagram showing the structure of a prior art power control apparatus.

Description will now be given as to an embodiment 7 of the power control apparatus according to the present invention in connection with FIG. 18. A low-pass filter circuit 79 shown in FIG. 18 substitutes for the low-pass filter circuit 19 illustrated in FIG. 1.

The low-pass filter circuit 79 has a low-pass filter 79a and a filter control circuit 79b. The low-pass filter 79a includes: a first resistor R71; a capacitor C70; an operational amplifier AMP70 which cooperates with the first resistor R71 and the capacitor C70 to form a low-pass filter having a first time constant; and a second resistor R72 which is connected in parallel to the first resistor R71 and cooperates with the first resistor R71, the capacitor C70 and the operational amplifier AMP70 to form a second low-pass filter that operates in accordance with a second time constant. It is to be noted that the operational amplifier AMP70 corresponds to the active device according to the present invention. The filter control circuit 79b has a diode D70 connected to the second resistor R72 in series.

The embodiment 7 demonstrates an example where the low-pass filter 79a includes the active device, i.e., it is constituted by an active low-pass filter, and the first time constant and the second time constant can be switched in the embodiment 7 as in the first embodiment, thereby obtaining advantages similar to those in the embodiment 1.

Further, addition of a reverse diode connected in parallel to each diode and substitution of a reverse diode for each diode are possible likewise in the embodiment 7 and, in this case, the falling characteristics of the transmitted power can be maintained at a constant state even if a change in temperature occurs.

As described above, although the power control apparatus according to the present invention can be applied to any device as long as it can automatically control the power level of an input signal and outputs the result, the power control apparatus is suitable for a device for controlling the power level of a transmitted output from a radio communication device. Particularly, it is well suited to the power control apparatus for a radio communication device adopting TDMA by which high-speed burst transmission is performed.

What is claimed is:

1. A power control apparatus comprising:
a power level adjusting circuit for adjusting an input signal to a desired power level in accordance with a control voltage to output the obtained result;
a control voltage generating circuit for comparing a current output power from said power level adjusting circuit with a target power level to generate said control voltage based on a result of comparison;
a low-pass filter operating in accordance with either a first time constant or a second time constant smaller than said first time constant, for filtering said control voltage generated by said control voltage generating circuit to be supplied to said power level adjusting circuit; and
filter controlling means which receives said control voltage and in response to said control voltage causes said low-pass filter to operate in accordance with said second time constant at a first transition of said output power of said power level adjusting circuit and for causing said low-pass filter to operate in accordance with said first time constant after the first transition of said output power of said power level adjusting circuit.

2. A power control apparatus as set forth in claim 1, wherein said low-pass filter includes: a first resistor; a capacitor which cooperates with said first resistor to form a first low-pass filter that operates in accordance with said first time constant; and a second resistor which is connected in parallel to said first resistor and cooperates with said first resistor and said capacitor to form a second low-pass filter that operates in accordance with said second time constant, said filter controlling means having a diode connected to said second resistor in series.

3. A power control apparatus as set forth in claim 1, wherein said low-pass filter includes: a first resistor; a capacitor which cooperates with said first resistor to form a first low-pass filter that operates in accordance with said first time constant; and a second resistor and cooperates with said first resistor and said capacitor to form a second low-pass filter that operates in accordance with said second time constant,
said filter controlling means having: a plurality of diodes connected to said second resistor in series; and a switch circuit for changing over connection between each of said diodes and said second resistor.

4. A power control apparatus as set forth in claim 1, wherein said low-pass filter includes: a first resistor; a capacitor which cooperates with said first resistor to form a first low-pass filter that operates in accordance with said first time constant; and a plurality of second resistors each of which is connected in parallel to said first resistor and cooperates with said first resistor and said capacitor to form a second low-pass filter that operates in accordance with said second time constant,
said filter controlling means having: a diode which is in series to each of a plurality of said second resistors; and a switch circuit for selectively connecting a plurality of said resistors to said diode.

5. A power control apparatus as set forth in claim 1, wherein said filter controlling means has a temperature sensor for detecting a temperature and changes over said first and second time constants in accordance with a temperature detected by said temperature sensor.

6. A power control apparatus as set forth in claim 1, wherein said low-pass filter includes: a first resistor; a capacitor; an active device which cooperates with said first resistor and said capacitor to form a low-pass filter having said first time constant; and a second resistor which is connected in parallel to said first resistor and cooperates with said first resistor, said capacitor and said active device to form a second low-pass filter that operates in accordance with said second time constant,
said filter controlling means having a diode connected in series to said second resistor.

7. A power control apparatus as set forth in claim 2, wherein said second resistor of said low-pass filter is constituted by a thermistor.

8. A power control apparatus comprising:
a power level adjusting circuit for adjusting an input signal to a desired power level in accordance with a control voltage to output the obtained result;
a control voltage generating circuit for comparing a current output power from said power level adjusting circuit with a target power level to generate said control voltage based on a result of comparison;
a low-pass filter operating in accordance with either a first time constant or a second time constant smaller than said first time constant, for filtering said control voltage generated by said control voltage generating circuit to be supplied to said power level adjusting circuit; and
filter controlling means which receives said control voltage and in response to said control voltage causes said low-pass filter to operate in accordance with said first time constant before a last transition of said output power of said power level adjusting circuit and for causing said low-pass filter to operate in accordance with said second time constant at the last transition of said output power of said power level adjusting circuit.

9. A power control apparatus as set forth in claim 8, wherein said low-pass filter includes: a first resistor; a capacitor which cooperates with said first resistor to form a first low-pass filter that operates in accordance with said first time constant; and a second resistor which is connected in parallel to said first resistor and cooperates with said-first resistor and said capacitor to form a second low-pass filter that operates in accordance with said second time constant, said filter controlling means having a diode connected in series to said second resistor.

10. A power control apparatus as set forth in claim 8, wherein said low-pass filter includes: a first resistor; a capacitor which cooperates with said first resistor to form a first low-pass filter that operates in accordance with said first time constant; and a second resistor which is connected in parallel to said first resistor and cooperates with said first resistor and said capacitor to form a second low-pass filter that operates in accordance with said second time constant, said filter controlling means having: a plurality of diodes connected in series to said second resistor; and a switch circuit for changing over connection between each of a plurality of said diodes and said second resistor.

11. A power control apparatus as set forth in claim 8, wherein said low-pass filter includes: a first resistor; a capacitor which cooperates with said first resistor to form a first low-pass filter that operates in accordance with said first time constant; and a plurality of second resistors each of which is connected in parallel to said first resistor and cooperates with said first resistor and said capacitor to form a second low-pass filter that operates in accordance with said second time constant,
said filter controlling means having: a diode which is in series to each of a plurality of said second resistors; and a switch circuit for selectively connecting a plurality of said second resistors to said diode.

12. A power control apparatus as set forth in claim 8, wherein said filter controlling means has a temperature sensor for detecting a temperature of said power control apparatus or an ambient temperature and changes over said first and second time constants in accordance with a temperature detected by said temperature sensor.

13. A power control apparatus as set forth in claim 8, wherein said.low-pass filter includes: a first resistor; a capacitor; an active device which cooperates with said first resistor and said capacitor to form a low-pass filter having said first time constant; and a second resistor which is connected in parallel to said first resistor and cooperates with said first resistor, said capacitor and said active device to form a second low-pass filter that operates in accordance with said second time constant,
said filter controlling means having a diode connected in series to said second resistor.

14. A power control apparatus as set forth in claim 9, wherein said second resistor of said low-pass filter is constituted by a thermistor.

15. A power control apparatus comprising:
a power level adjusting circuit for adjusting an input signal to a desired power level in accordance with a control voltage to output the obtained result;
a control voltage generating circuit for comparing a current output power from said power level adjusting circuit with a target power level to generate said control voltage based on a result of comparison;
a low-pass filter operating in accordance with either a first time constant or a second time constant smaller than said first time constant, for filtering said control voltage generated by said control voltage generating circuit to be supplied to said power level adjusting circuit; and
filter controlling means which receives said control voltage and in response to said control voltage causes said low-pass filter to operate in accordance with said second time constant at a first transition of said output power of said power level adjusting circuit, for causing said low-pass filter to operate in accordance with said first time constant after the first transition of said output power of said power level adjusting circuit, for causing said low-pass filter to operate in accordance with said first time constant before a last transition of said output power of said power level adjusting circuit and for causing said low-pass filter to operate in accordance with said second time constant at a last transition of said output power of said power level adjusting circuit.

\* \* \* \* \*

UNITED STATES PATENT AND TRADEMARK OFFICE
CERTIFICATE OF CORRECTION

PATENT NO. : 6,259,571 B1
DATED : July 10, 2001
INVENTOR(S) : Hubert Holderer, et al.

It is certified that error appears in the above-identified patent and that said Letters Patent is hereby corrected as shown below:

<u>Title page,</u>
Item [73], Assignee: "Carl-Zeiss-Stiftung" should be --Carl-Zeiss Stiftung trading as Carl Zeiss --

Signed and Sealed this

Seventeenth Day of December, 2002

JAMES E. ROGAN
*Director of the United States Patent and Trademark Office*